Figure 1:
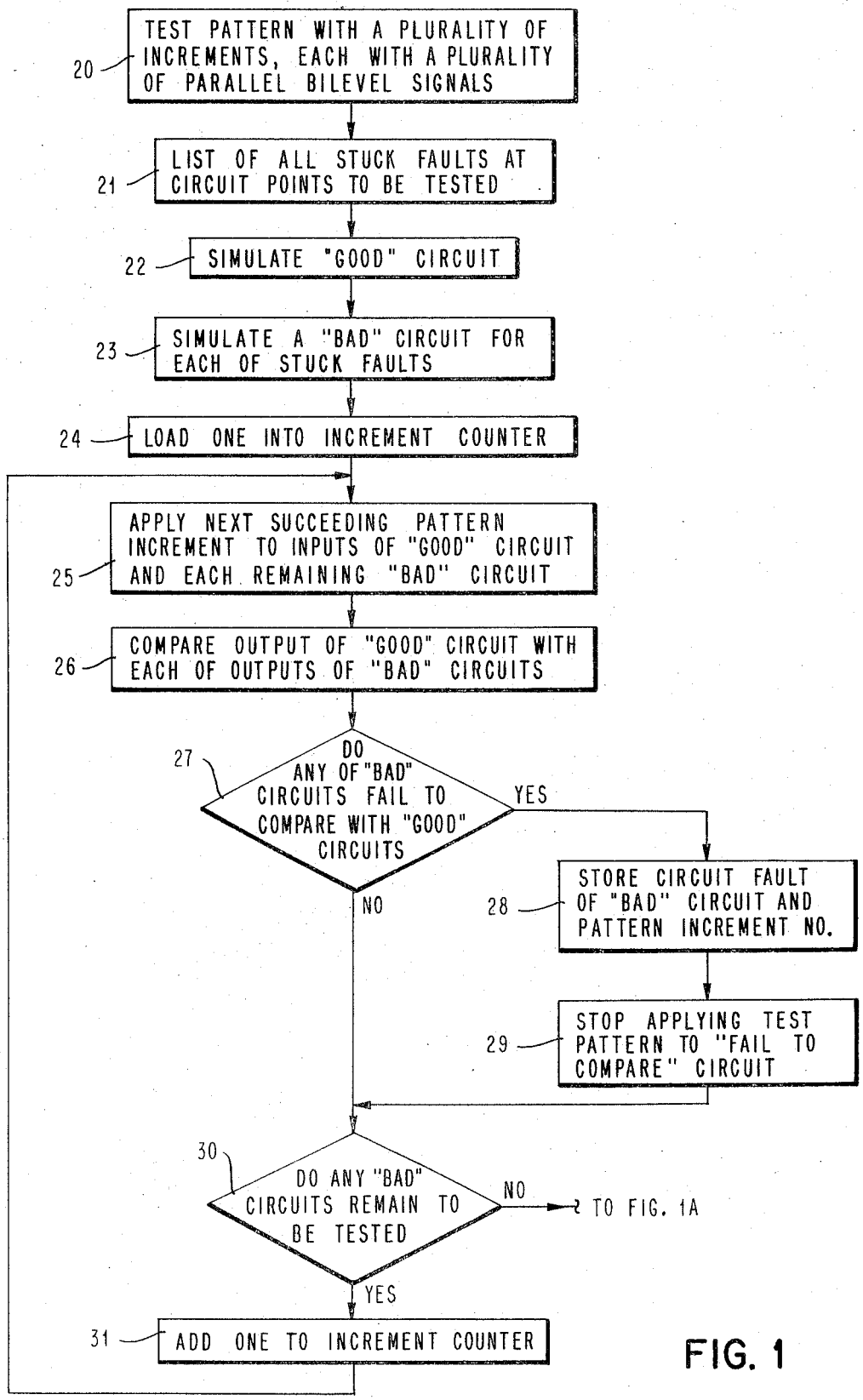
Figure 1A:
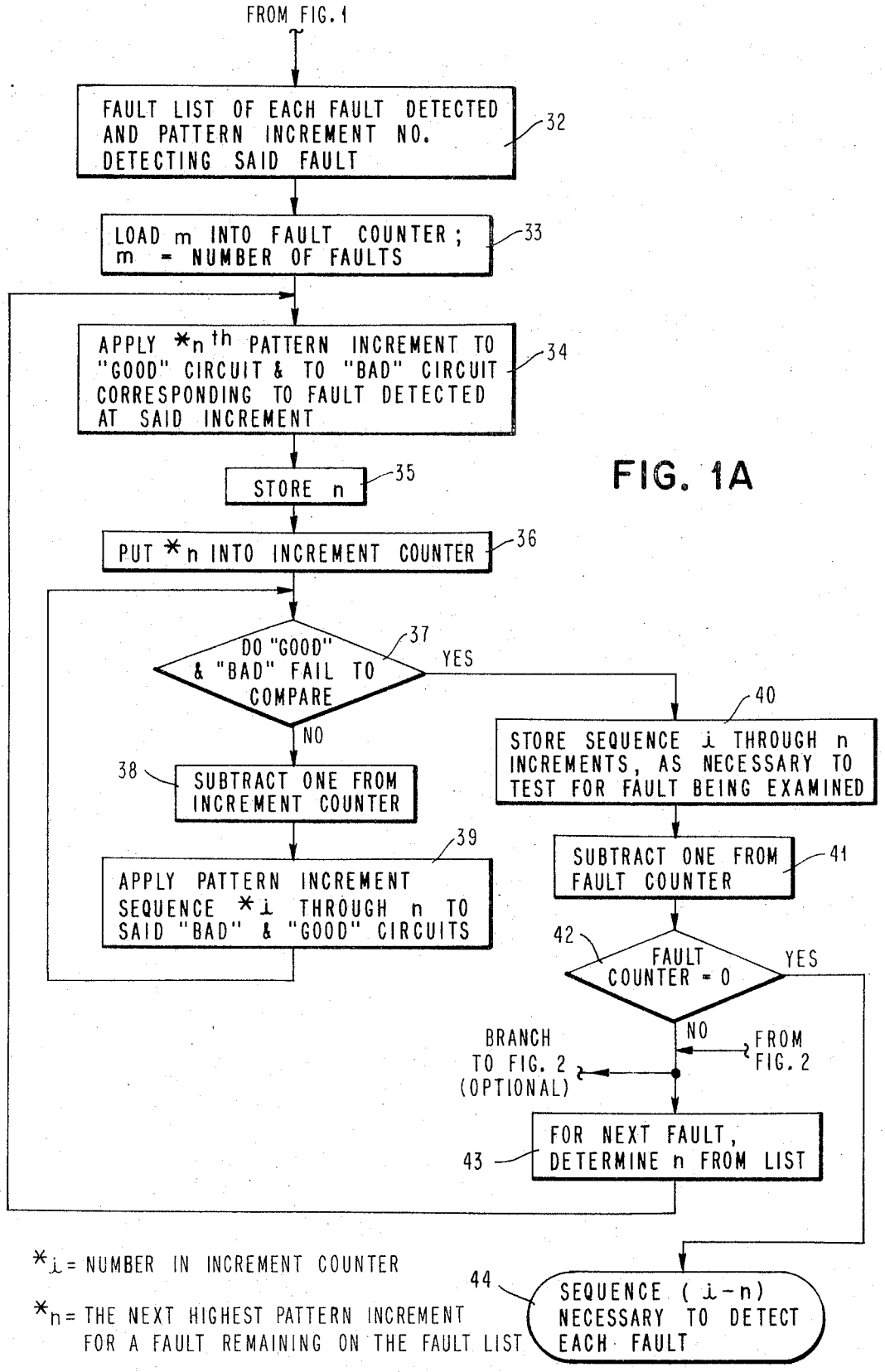
Figure 2:
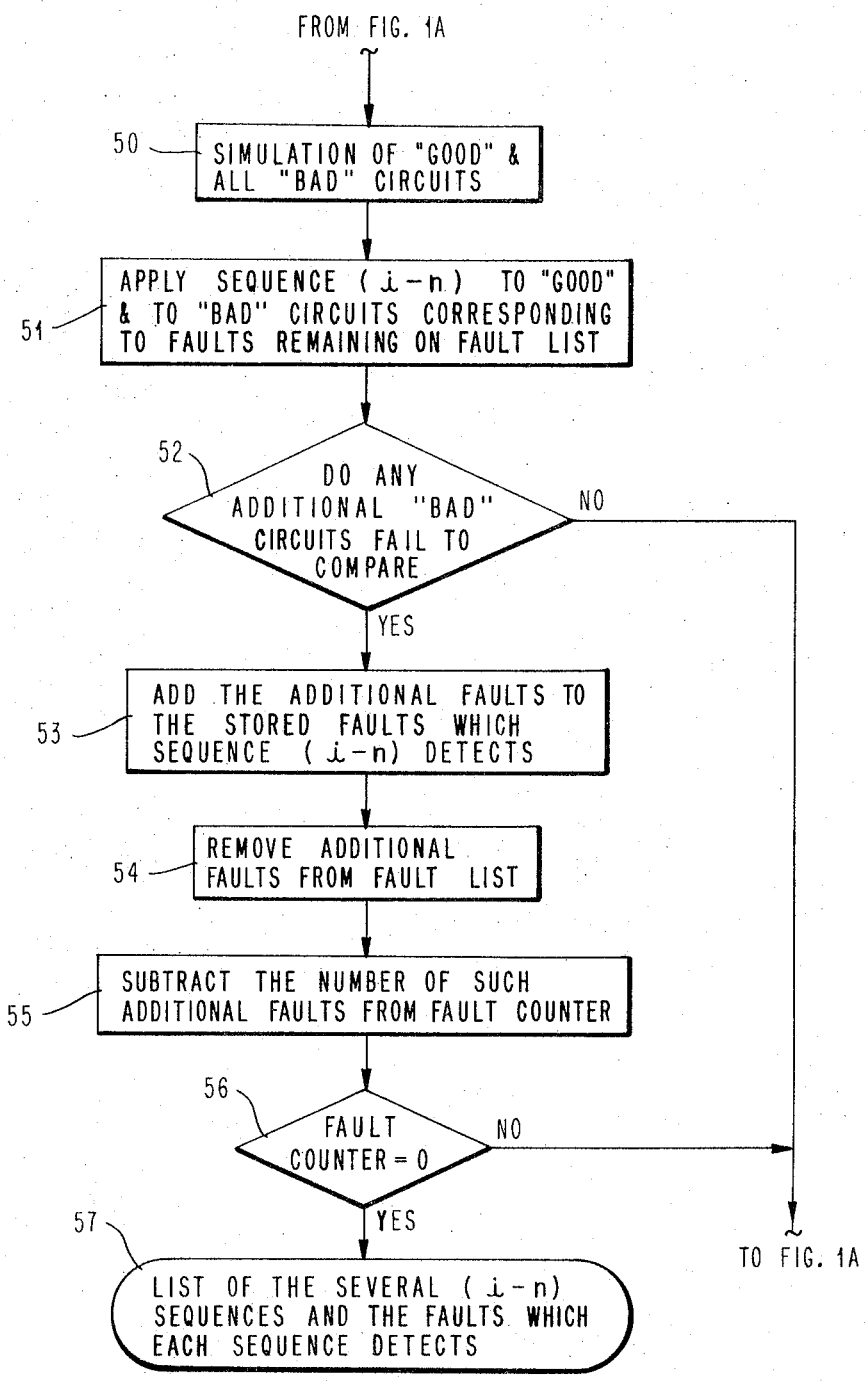
Figure 3:
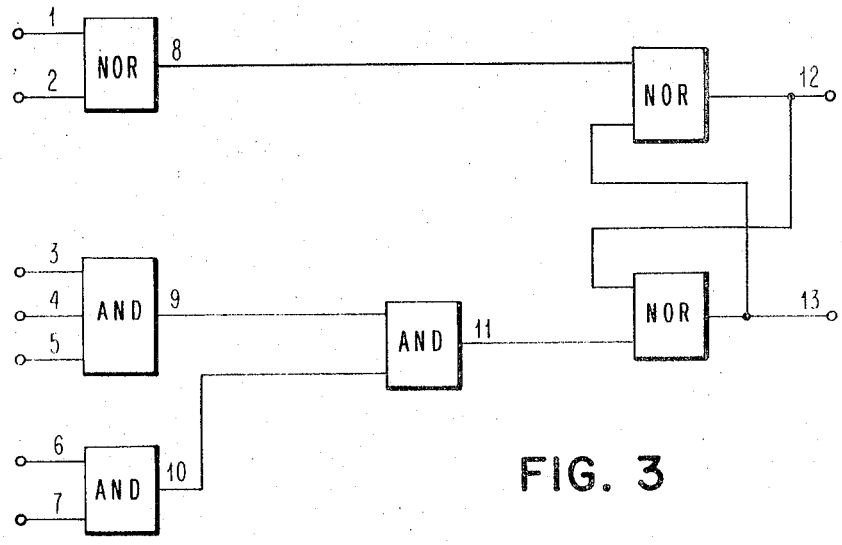
Figure 5:
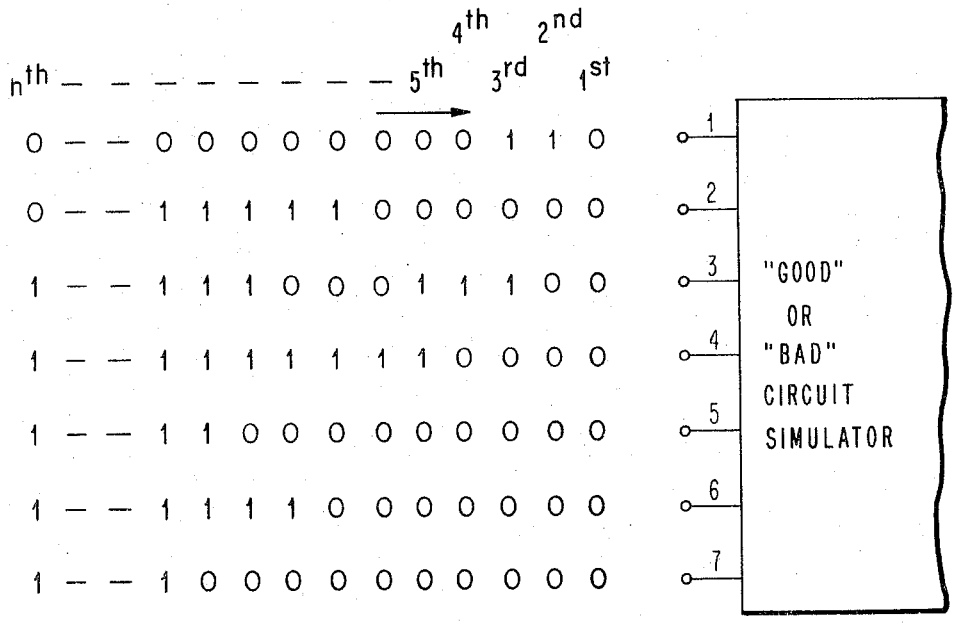

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED NOVEMBER 5, 1974

928 O.G. 6

T928,004

SYSTEM FOR REDUCING THE NUMBER OF INCREMENTS IN A BILEVEL ELECTRICAL SIGNAL TEST PATTERN FOR NON-LINEAR CIRCUITS

Robert G. Carpenter and Eric Lindbloom, Poughkeepsie, and Maurice T. McMahon, Jr., Wappingers Falls, N.Y., assignors to International Business Machines Corporation, Armonk, N.Y.

Continuation of abandoned application Ser. No. 235,485, Mar. 17, 1972. This application Oct. 24, 1973, Ser. No. 409,123

**Int. Cl. G06f *11/00***

U.S. Cl. 235—151.3

5 Sheets Drawing. 21 Pages Specification

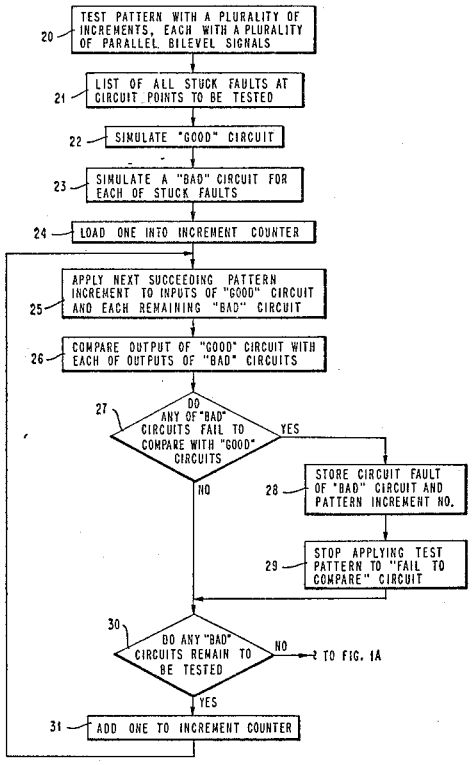

A system involving the use of fault simulation for reducing the number of increments in a bilevel electrical signal test pattern for a non-linear integrated circuit. First, for each "stuck" fault to be detected by the reduced pattern, the number of the pattern increment on which said fault is detected in the original pattern is determined. Then, for each stuck fault, the pattern increment on which the fault was detected in the original test pattern is applied to a "good" circuit computer simulation and a "bad" circuit computer simulation representative of said fault. If there is a "fail to compare," the applied pattern alone is sufficient to detect the fault. However, if the outputs from both simulations compare, an increment sequence consisting of the increment next preceding the previously applied increment followed by the applied increment is reapplied to the good and bad simulations, and the procedure is repeated, each time adding the next preceding increment to the sequence until a fail to compare is achieved. Such a sequence is determined for each stuck fault.

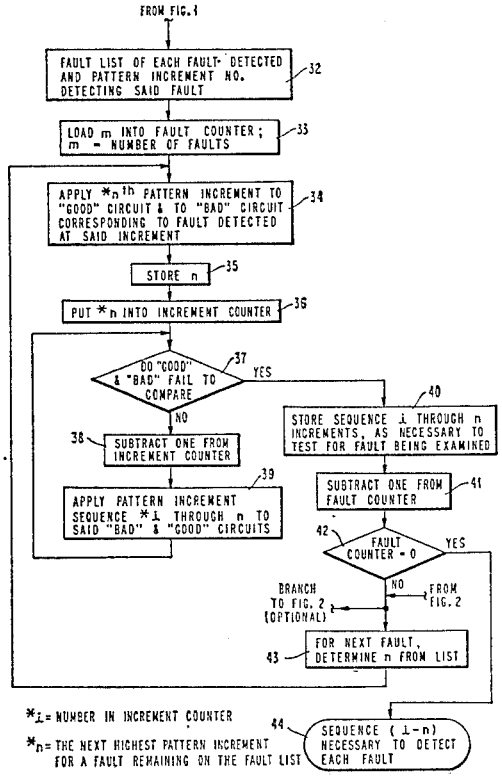

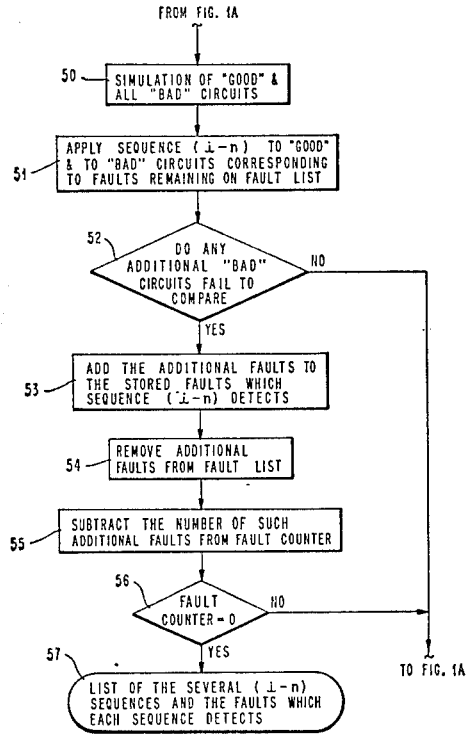

SYSTEM FOR REDUCING THE NUMBER OF INCREMENTS IN A BILEVEL ELECTRICAL SIGNAL TEST PATTERN FOR NON-LINEAR CIRCUITS

Original Filed March 17, 1972 5 Sheets-Sheet 1

*i = NUMBER IN INCREMENT COUNTER

*n = THE NEXT HIGHEST PATTERN INCREMENT FOR A FAULT REMAINING ON THE FAULT LIST

| "GOOD" CIRCUIT SIMULATION | "BAD" CIRCUIT SIMULATIONS | | | |
|---|---|---|---|---|
| | POINT 3 STUCK AT "ONE" | POINT 3 STUCK AT "ZERO" | POINT 11 STUCK AT "ONE" | POINT 11 STUCK AT "ZERO" |
| LD 1 | LD 1 | LD 1 | LD 1 | LD 1 |
| OR 2 | OR 2 | OR 2 | OR 2 | OR 2 |
| COMP | COMP | COMP | COMP | COMP |
| STO 8 | STO 8 | STO 8 | STO 8 | STO 8 |
| LD 3 | LD "ONE" | LD "ZERO" | LD 3 | LD 3 |
| AND 4 | AND 4 | AND 4 | AND 4 | AND 4 |
| AND 5 | AND 5 | AND 5 | AND 5 | AND 5 |
| STO 9 | STO 9 | STO 9 | STO 9 | STO 9 |
| LD 6 | LD 6 | LD 6 | LD 6 | LD 6 |
| AND 7 | AND 7 | AND 7 | AND 7 | AND 7 |
| STO 10 | STO 10 | STO 10 | STO 10 | STO 10 |
| LD 9 | LD 9 | LD 9 | LD 9 | LD 9 |
| AND 10 | AND 10 | AND 10 | AND 10 | AND 10 |
| STO 11 | STO 11 | STO 11 | STO "ONE" | STO "ZERO" |
| LD 8 | LD 8 | LD 8 | LD 8 | LD 8 |
| OR 13 | OR 13 | OR 13 | OR 13 | OR 13 |
| COMP | COMP | COMP | COMP | COMP |
| STO 12 | STO 12 | STO 12 | STO 12 | STO 12 |
| LD 11 | LD 11 | LD 11 | LD 11 | LD 11 |
| OR 12 | OR 12 | OR 12 | OR 12 | OR 12 |
| COMP | COMP | COMP | COMP | COMP |
| STO 13 | STO 13 | STO 13 | STO 13 | STO 13 |

FIG. 4